United States Patent [19]
Hulvey

[11] Patent Number: 5,844,622
[45] Date of Patent: Dec. 1, 1998

[54] DIGITAL VIDEO HORIZONTAL SYNCHRONIZATION PULSE DETECTOR AND PROCESSOR

[75] Inventor: Robert W. Hulvey, Hermosa Beach, Calif.

[73] Assignee: TRW Inc., Redondo Beach, Calif.

[21] Appl. No.: 570,154

[22] Filed: Dec. 12, 1995

[51] Int. Cl.⁶ .................................................. H04N 5/05
[52] U.S. Cl. ........................ 348/546; 348/516; 348/531; 386/12; 386/84
[58] Field of Search ..................................... 348/546, 531, 348/536, 541–545, 500, 513, 516, 524, 521, 522; 386/12, 71, 84, 124, 119

[56] References Cited

U.S. PATENT DOCUMENTS

| | | |
|---|---|---|
| 4,074,307 | 2/1978 | Dischert et al. . |
| 4,165,524 | 8/1979 | Ninomiya ................................ 348/515 |
| 4,287,529 | 9/1981 | Tatami et al. ............................ 348/615 |
| 4,349,833 | 9/1982 | Clarke ..................................... 348/639 |
| 4,402,011 | 8/1983 | Newton . |
| 4,471,299 | 9/1984 | Elmis . |
| 4,488,170 | 12/1984 | Nillesen . |
| 4,578,705 | 3/1986 | Elmis et al. . |
| 4,675,722 | 6/1987 | Hackett . |
| 4,675,734 | 6/1987 | Widom . |
| 4,688,094 | 8/1987 | Tanabe et al. . |
| 4,689,582 | 8/1987 | Balaban et al. ........................... 331/20 |
| 4,701,796 | 10/1987 | Kamiya . |
| 4,736,162 | 4/1988 | Ishihara . |
| 4,780,759 | 10/1988 | Matsushima et al. . |
| 5,121,086 | 6/1992 | Srivastava ................................ 331/11 |
| 5,124,671 | 6/1992 | Srivastava . |
| 5,126,639 | 6/1992 | Srivastava . |
| 5,132,794 | 7/1992 | Okada et al. ............................ 348/531 |
| 5,161,011 | 11/1992 | Pletz-Kirsch et al. . |
| 5,446,715 | 8/1995 | Satomura .................................. 369/49 |
| 5,495,294 | 2/1996 | Evans et al. ............................. 348/536 |
| 5,539,343 | 7/1996 | Yamashita et al. ...................... 327/142 |
| 5,608,462 | 3/1997 | Maas et al. .............................. 348/531 |

OTHER PUBLICATIONS

Jong, M.T., Methods of Discrete Signal and System Analysis, McGraw–Hill, p. 337, Dec. 31, 1982.

*Primary Examiner*—Tommy P. Chin
*Assistant Examiner*—Vu Le
*Attorney, Agent, or Firm*—Michael S. Yatsko

[57] ABSTRACT

The invention pertains to a digital video horizontal synchronization pulse detector and processor comprising pulse detector for generating a timing pulse in response to each horizontal synchronization pulse. A sync position error device generates a time position error signal for each timing pulse relative to a corresponding window pulse. A window pulse generator generates the window pulses and limits the time position error signals to a maximum value. An acquisition device tracks when the timing pulses occur inside and outside the corresponding window pulses. An averaging device averages the time position error signals to generate an average error signal. A counter phase locks to the timing pulses to generate processed horizontal sync pulses such that when the timing pulses occur within the corresponding window pulses the counter is adjusted by the average error signal and when a predetermined number of timing pulses occur outside the corresponding window pulses, the counter is loaded with a predetermined value during a timing pulse to align the timing pulses with the corresponding window pulses.

26 Claims, 12 Drawing Sheets

DIGITAL VIDEO HORIZONTAL SYNCHRONIZATION PULSE DETECTOR AND PROCESSOR

BACKGROUND OF THE INVENTION

1. Field of the Invention

This invention relates generally to digital processing of an analog video signal and, more particularly, to a digital video horizontal synchronization pulse detector and processor for detecting and processing horizontal synchronization pulses in the analog video signal.

2. Discussion of the Related Art

Today there are many video products which process digital representations of analog video signals. For example, video digitizers, digital video scramblers and descramblers, televisions, video cassette recorders and video recorders which record analog video in a digital format. In each of these video products, the analog video signal is generally digitized and stored in memory for subsequent use.

In both analog systems and digital systems it is necessary to extract the horizontal synchronization pulses in the analog video signal to synchronize each horizontal scanning line for the display image. In standard NTSC (National Television System Committee) composite analog video signals which use interlace scanning, there are about 525 horizontal scanning lines per vertical frame. The frame is divided into two vertical scanning fields (i.e. odd and even fields), each field having about 262.5 horizontal scanning lines. The horizontal synchronization pulses occur for each horizontal scanning line to provide horizontal synchronization of the display image.

In many of the digital video products in use today, the horizontal synchronization pulse from the analog video signal is regenerated in a clean digital format and used for the horizontal line synchronization of the image, in addition to generating a horizontal sync memory map of the digitized analog video signal. During memory mapping each pixel of the digitized analog video signal is generally stored in X and Y addresses in the digital memory with the horizontal sync pulse used to reset the X addresses and the vertical sync pulse used to reset the Y addresses. In addition, the regenerated horizontal sync pulse can also be used for timing information in on-screen display circuitry.

Most conventional horizontal sync pulse detection is performed using analog differentiation circuitry. However, use of such conventional analog circuitry for digital video products is not practical because of the large number and the size of the analog components required. Digital signal processing can be used in place of the analog horizontal sync pulse detection devices. However, use of conventional digital signal processing for horizontal sync pulse detection also has several disadvantages. Specifically, a very large number of digital gates are ordinarily required which is costly. This also makes it extremely difficult, if not impossible to integrate such circuitry into a single integrated circuit. Still further, both the simple analog and digital horizontal sync detectors generally have poor noise immunity and in order to achieve better noise immunity, this creates circuits that are unduly complex and prohibitively expensive.

What is needed then is a digital video horizontal synchronization pulse detector and processor which does not suffer from the above-mentioned disadvantages. This will, in turn, reduce the number of gates required, reduce the cost of the overall circuit, increase noise immunity and decrease size such that the system can be incorporated into a single integrated circuit with other video processing circuitry. It is, therefore, an object of the present invention to provide such a digital video horizontal synchronization pulse detector and processor.

SUMMARY OF INVENTION

In accordance with the teachings of the present invention, a digital video horizontal synchronization pulse detector and processor for detecting and processing horizontal synchronization pulses in a video signal is disclosed. The digital video horizontal synchronization pulse detector and processor detects the horizontal synchronization pulses and generates processed horizontal sync pulses to be used to provide horizontal image synchronization, memory mapping and on-screen display timing. This is basically achieved by generating timing pulses in response to the horizontal synchronization pulses and signals representing time position errors of the timing pulses relative to window pulses. A counter generates the processed horizontal sync pulses in response to the timing pulses and is adjusted depending on whether the timing pulses are occurring inside or outside the window pulses.

In one preferred embodiment, a pulse detector generates a timing pulse in response to each horizontal synchronization pulse. A sync position error device generates a time position error signal for each timing pulse relative to a corresponding window pulse. A window pulse generator generates the window pulse and limits the timed position error signal to a maximum value. An acquisition device tracks when the timing pulses occur inside and outside the corresponding window pulses. An averaging device is used to generate a signal representing the average error in response to the time position errors signals. A counter is then used to phase-lock to the timing pulses to generate processed horizontal sync pulses. When the timing pulses occur within the corresponding windows pulses, the counter is adjusted by the average error signal and when a predetermined number of timing pulses occur outside the corresponding window pulses, the counter is loaded with a predetermined value during a timing pulse to align the timing pulses with the corresponding window pulses.

Use of the present invention provides a digital video horizontal synchronization pulse detector and processor for detecting horizontal synchronization pulses in video signals. As a result, the aforementioned disadvantages associated with the current horizontal synchronization pulse detectors and processors have been substantially eliminated.

BRIEF DESCRIPTION OF THE DRAWINGS

Still other advantages of the present invention will become apparent to those skilled in the art after reading the following specification and by reference to the drawings in which.

DETAILED DESCRIPTION OF THE PREFERRED EMBODIMENT(S)

The following description of the preferred embodiment concerning a digital video horizontal synchronization pulse detector and processor for detecting and processing horizontal synchronization pulses in an analog video signal is merely exemplary in nature and is in no way intended to limit the invention or its application or uses. Moreover, while the present invention is described in detail below with reference to NTSC (National Television System Committee) format video signals, it would be appreciated by those skilled in the art that the present invention, as defined by the appended claims, is clearly not limited to only NTSC format video signals and may include other types of video signal formats such as PAL (Phase Alternation By Line) or SECAM (Sequence a Memoire).

Figure 1:
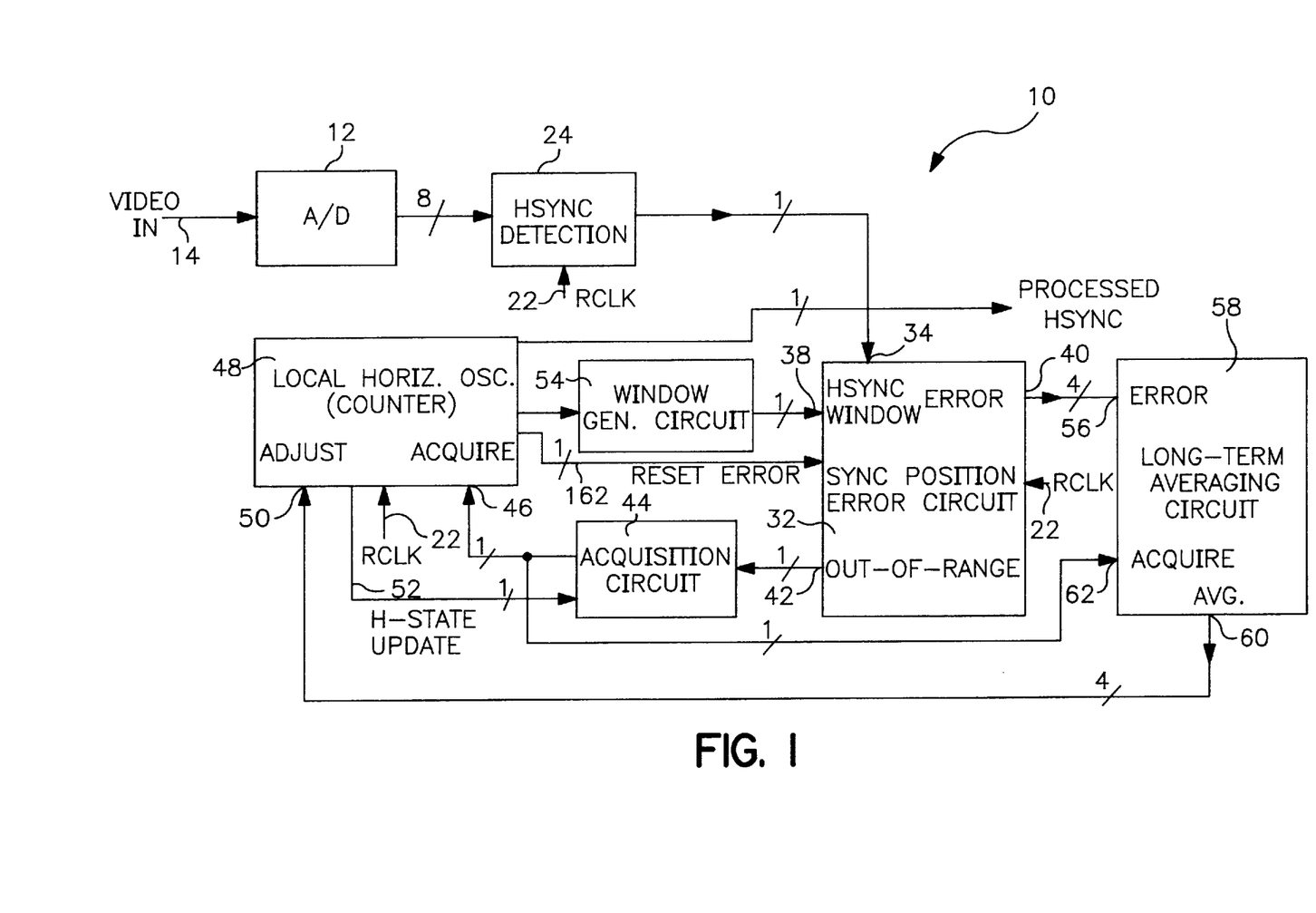
FIG. 1 is a schematic block diagram of one preferred embodiment of the present invention.

Referring to FIG. 1, a digital video horizontal synchronization pulse detector and processor 10 for detecting and processing horizontal sync pulses in an analog video signal to regenerate a stable, noise immune digital horizontal sync pulse is shown. The digital video horizontal synchronization pulse detector and processor 10 utilizes an 8-bit digital-to-analog converter 12 for receiving an analog video signal 14 in NTSC format. The analog video signal 14, shown clearly in FIGS. 7–10, includes multiple horizontal sync pulses 16 which occur about every 63.5 microseconds ($\mu$sec) or 15.734 KHz. The horizontal sync pulses 16 occur after a blanking portion 18 of the analog video signal 14.

The 8-bit analog-to-digital converter 12 digitizes the analog video signal 14 at a clock rate of preferrably about 14.318 MHz which is about four times the frequency of a color burst signal 20 (FIG. 8) in the analog video signal 14. One way of generating the 14.318 MHz clock is described in detail in application Ser. No. 08/571,018, entitled "DIGITAL PHASE ERROR DETECTOR FOR LOCKING TO COLOR SUBCARRIER OF VIDEO SIGNALS", naming as inventors Gregory A. Shreve, Kim S. Guzzino and Robert W. Hulvey filed on Dec. 12, 1995, which is hereby incorporated by reference. However, it would be appreciated by those skilled in the art that various other ways of generating the 14.318 MHz clock pulse for the analog-to-digital converter 12 can also be used. The 14.318 MHz clock pulse, hereinafter referred to as the reference clock (RCLK) 22 is also used throughout the digital video horizontal synchronization pulse detector and processor 10.

An 8-bit digital data stream is generated by the analog-to-digital converter 12 and applied to a horizontal sync detection circuit 24. The horizontal sync detection circuit 24 is clocked by the reference clock 22 and detects the horizontal sync pulses 16 of the analog video signal 14. The 8-bit digital data stream applied to the horizontal sync detection circuit 24 is first low pass filtered to remove substantially all of the color burst signal 20 near the horizontal sync pulses 16 and other spurious noise. The horizontal sync detection circuit 24 then strips the video signal 14 of its active video portion 26 by clipping or clamping the digital data stream. Once the digital data stream is clamped, the horizontal sync detection circuit 24 detects the horizontal sync pulses 16 by differentiation of the digital data stream using a digital delay and a differencing circuit, details of which will be discussed in detail hereinafter. The horizontal sync detection circuit 24 then outputs a 1-bit timing pulse or external horizontal sync pulse 30 (i.e. EXT HSYNC) (FIG. 7) which is applied to a sync position error circuit 32 (FIG. 1).

The sync position error circuit 32 receives the external horizontal sync pulse 30 at a HSYNC input 34. If the external horizontal sync pulse 30 is within a window pulse 36 received at a window input 38 (FIGS. 7–10), the rising edge position of the external horizontal sync pulse 30 is measured relative to a certain count in an internal counter, details of which will be discussed hereinafter. This counter which is reset from a reset error pulse 162 generates a positive or negative time position error value if the rising edge of the external horizontal sync pulse 30 is not centered within the window pulse 36. This error value is output from an error output 40. If the external horizontal sync pulse 30 is not within the window pulse 36, a 1-bit out-of-range output 42 goes low (i.e. digital logic "0") which is applied to an acquisition circuit 44. In addition, the time position error value is also limited to a maximum error value because of the window pulse 36.

The acquisition circuit 44 essentially counts up or down depending on the digital output from the out-of-range output 42. The acquisition circuit 44 is incremented up or positively whenever an external horizontal sync pulse 30 occurs that is out-of-range of the window pulse 36 (i.e. out-of-range output 42=0). The acquisition circuit 44 is decremented down or negatively whenever an external horizontal sync pulse 30 occurs within the window pulse 36 (i.e. out-of-range output 42=1). If the acquisition circuit 44 is incremented up to a predetermined maximum value, the acquisition circuit 44 outputs a 1-bit digital high signal (i.e. digital "1") indicating that the digital video horizontal sync pulse detector and processor 10 is now in an "acquire" mode which occurs when the external horizontal sync pulse 30 is not being properly tracked, that is, occurring within the window pulse 36. When the external horizontal sync pulse 30 is being tracked, the acquisition circuit 44 outputs a 1-bit digital low signal (i.e. digital "0") indicating that the digital video horizontal synchronization pulse detector and processor 10 is in a "track" mode.

The digital output of the acquisition circuit 44 is applied to an acquire input 46 of a local horizontal counter 48. The local horizontal counter 48 essentially acts as a saw-tooth oscillator which is phase-locked to the external horizontal sync pulse 30. The horizontal counter 48 is clocked by the reference clock 22 and has a period equal to the period of a single horizontal line in the video signal 14. That is, in NTSC format, the horizontal counter 48 will count from 0 to 909 and then reset to 0 and count again to 909 continuously since there are 910 samples or pixels in each horizontal scanning line.

When the horizontal counter 48 is in the "track" mode (i.e. acquire input 46=0), the horizontal counter continuously counts from 0 to 909 and is adjusted by an adjust input 50 after an external horizontal sync pulse 30 has occurred during a H-state update signal 52. This adjustment positions the count in the horizontal counter 48 so that the next external horizontal sync pulse 30 is positioned nearer the center of the window pulse 36.

When the horizontal counter 48 is in the "acquire" mode (i.e. acquire input 46=1), the horizontal counter 48 is loaded with a predetermined value during the external horizontal sync pulse 30. This predetermined value loads the count in the horizontal counter 48 into a position where the external horizontal sync pulse 30 should be positioned in the window pulse 36 during the next occurrence of the external horizontal sync pulse 30.

A window generator circuit 54 generates the window pulse 36 which is used to determine whether or not the local horizontal counter 48 is locked to the external horizontal sync pulse 30 and the relative timing or phase error of the external horizontal sync pulse 30 with respect to the window pulse 36. The window generator circuit 54 is configured to generate a window pulse 36 during which the external horizontal sync pulse 30 should occur and is preferably set to occur during counts 22 to 37 of the horizontal counter 48. The window generator circuit 54 also places limits on the maximum value for the phase or timing error.

The error signal from the sync position error circuit 32 is applied to an error input 56 of a long term averaging circuit 58. The long term averaging circuit 58 receives the error value signal from the error input 56 and averages the error value with previously accumulated error values in a leaky accumulator which is updated once every horizontal line, details of which will be discussed hereinafter. The signal representing the average error is then outputted at an average output 60 which is applied to the adjust input 50 of the horizontal counter 48. This average error signal is used during the "track" mode to fine tune or adjust the count of the horizontal counter 48 such that the external horizontal sync pulse 30 occurs substantially in the center of the window pulse 36. If the acquisition circuit 44 increments to its maximum predetermined value, thus placing the horizontal counter 48 in the "acquire" mode (i.e. acquire input 46=1), the output from the acquisition circuit 44 is also applied to an acquire input 62 in the long term averaging circuit 58 which clears or resets the previous accumulated average error.

Figure 2A:
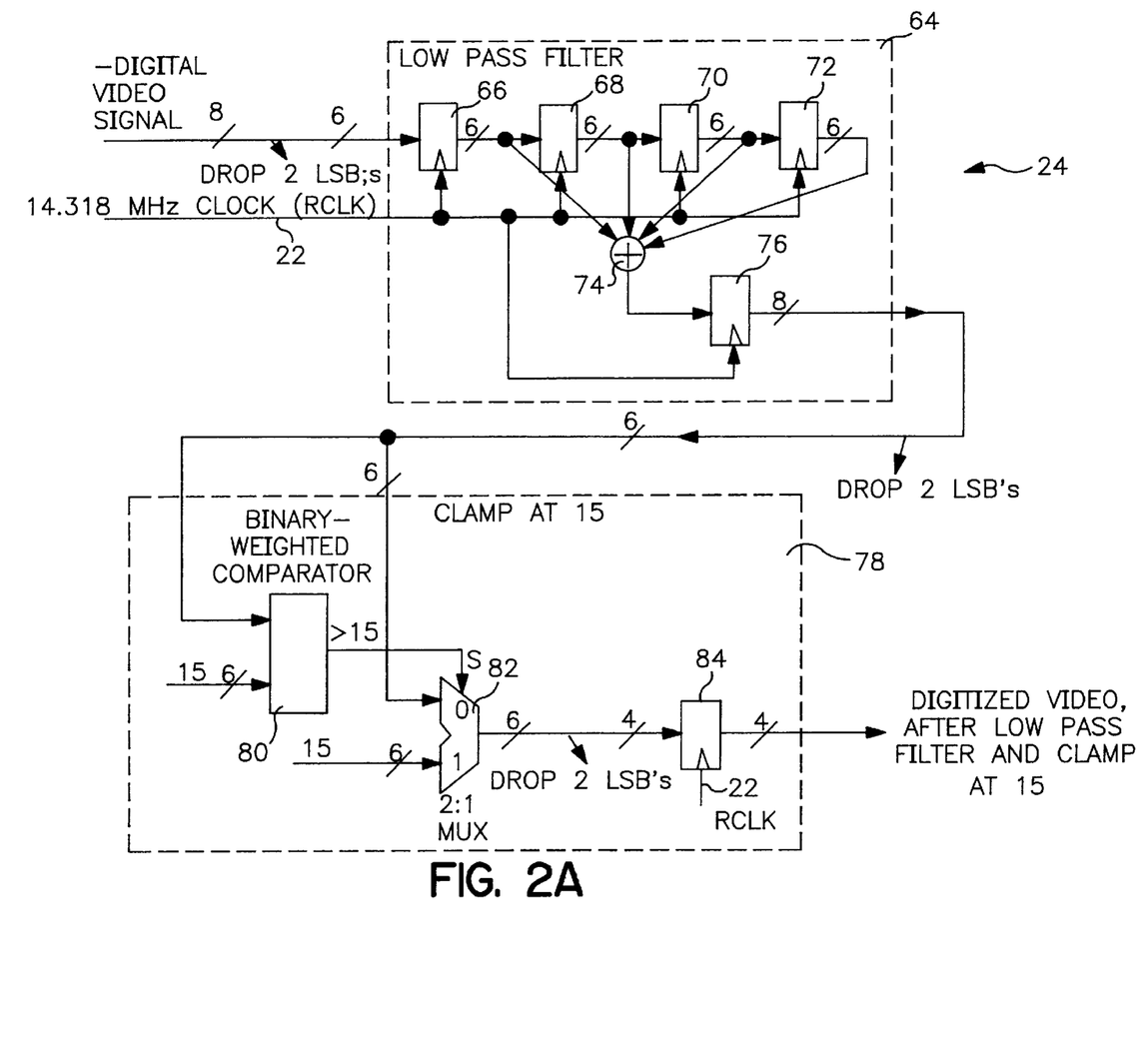
FIGS. 2A and 2B are a schematic block diagram of a horizontal sync detection circuit of the present invention.
Figure 2B:
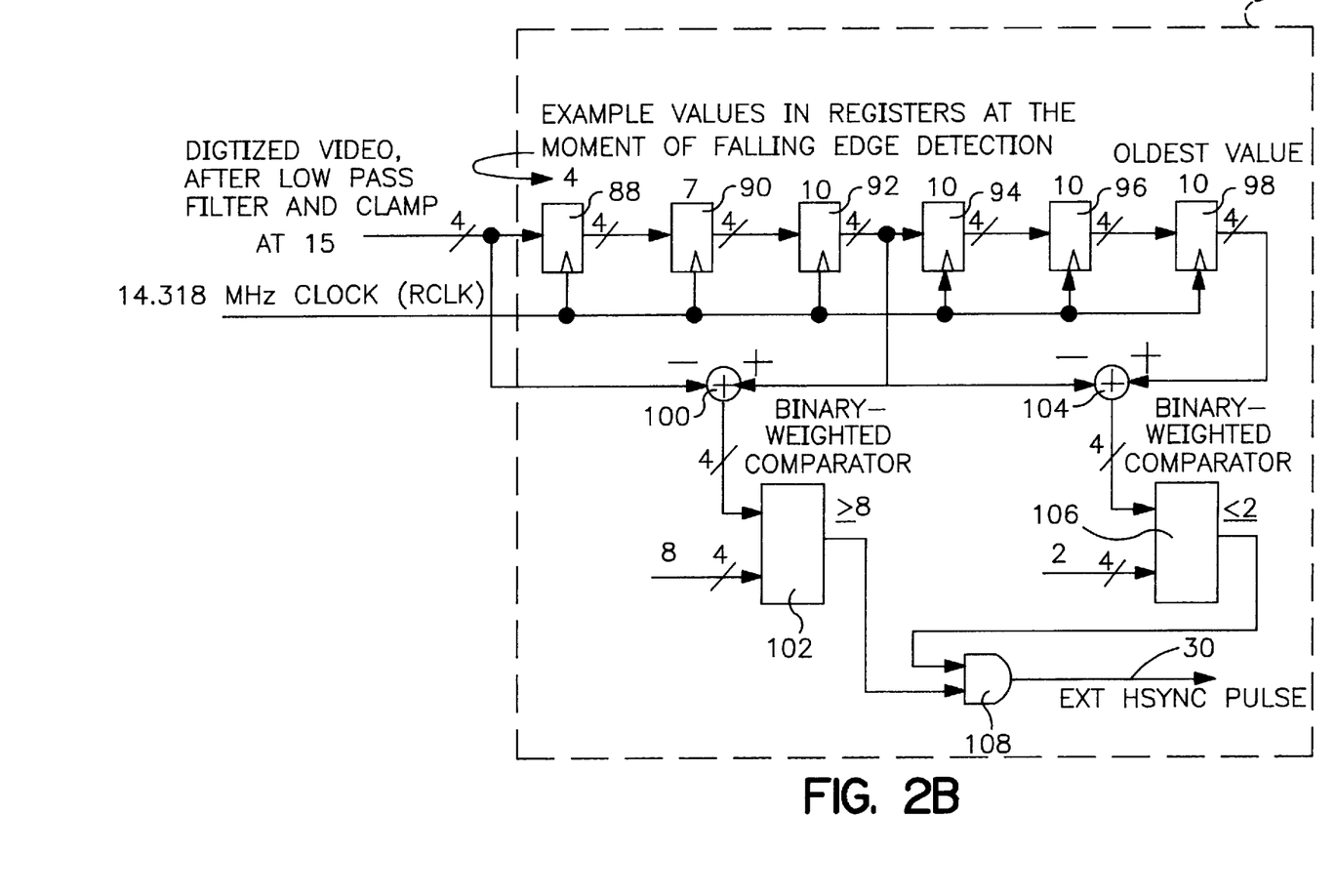

Referring now to FIGS. 2A and 2B, a detailed schematic block diagram of the horizontal sync detection circuit 24 is shown. The horizontal sync detection circuit 24 receives the 8-bit digital data stream from the analog-to-digital converter 12 and drops the first two (2) least significant bits (LSBs) to generate a 6-bit digital data stream. The first two (2) bits are dropped because the horizontal sync detection circuit 24 is looking for the falling edge of the digitized horizontal sync pulse 16 and the first two (2) bits are generally noise. This 6-bit digital data stream is applied to a low pass filter 64 which averages the 6-bit digital data stream to smooth out the signal and remove noise and transients.

The low pass filter 64 includes four (4) 6-bit DQ digital registers 66–72 which are each clocked by the reference clock 22 to delay the 6-bit digital data stream by one (1) clock pulse each. For example, the 6-bit digital data stream output from the digital register 66 would be delayed by one (1) reference clock pulse 22 while the digital register 72 would be delayed by four (4) reference clock pulses 22. The delayed digital data from the digital registers 66–72 are applied to an 8-bit adder 74 which adds the digital data applied to it and applies it to a digital register 76. The adder 74 is 8-bits since the accumulated digital data from the registers 66–72 would overflow otherwise. This 8-bit digital data stream at the adder 74 is applied to the 8-bit D-Q digital register 76 to align the 8-bit digital data stream with the reference clock 22. The bottom two (2) least significant bits (LSBs) are again dropped because these bits generally only include noise components and are not necessary to determine the falling edge of the horizontal sync pulse 16.

The 6-bit digital data stream is then applied to a clamping circuit 78. The clamping circuit 78 includes a 6-bit binary weighted comparator 80, a 2-to-1 multiplexer 82 and a 4-bit D-Q digital register 84. The binary weighted comparator 80 receives the 6-bit digital data stream from the digital register 76 and compares the value of the digital data with a predetermined reference value, which is preferably set to about 15. If the digital data stream exceeds this value, the binary weighted comparator 80 outputs a 1-bit digital high output to a select input of the 2-to-1 multiplexer 82. Upon receipt of the digital high output, the multiplexer 82 outputs a 6-bit binary number having a value of 15. If the digital data applied to the binary weighted comparator 80 is less than 15, the comparator 80 provides a 1-bit digital low output, such that the 6-bit digital data stream from the digital register 76 is passed through the 2-to-1 multiplexer 82. Only the four (4) least significant bits (LSBs) from the multiplexer 82 are used since the value of the digital data is clamped to 15 and the top (2) most significant bits (MSBs) will always be zero (0). This 4-bit digital data stream is applied to the 4-bit D-Q digital register 84 to again align the 4-bit digital data stream with the reference clock 22.

The aligned 4-bit digital data stream from the digital register 84 is then applied to a falling edge detector 86. The falling edge detector 86 includes two sets of three (3) cascaded 4-bit D-Q digital registers 88–98, each clocked by the reference clock 22. The 4-bit digital data stream is applied to a first 4-bit differencer 100 before and after being delayed by three (3) reference clock pulses 22 through the three (3) cascaded 4-bit digital registers 88–92 (i.e. each digital register 88–92 delays the 4-bit digital data stream by 1 reference clock pulse 22). The differencer 100 is essentially used for detecting a substantially steep slope between two points in time which would indicate a falling edge of the horizontal sync pulse 16.

The 4-bit digital data stream from the differencer 100 is applied to a 4-bit binary weighted comparator 102 which compares the 4-bit digital data stream to a predetermined reference value, preferably set to a value of eight (8). If the binary value of the 4-bit digital data stream is greater than or equal to eight (8), the binary weighted comparator 102 outputs a digital high output indicating that an edge of a pulse has been detected.

A second 4-bit differencer 104 receives the 4-bit digital data stream before and after being delayed by three (3) reference clock pulses 22 with the second set of three (3) cascaded 4-bit digital registers 94–98 (i.e. each digital register 94–98 delays the 4-bit digital data stream by 1 reference clock pulse 22). The 4-bit digital data stream applied to the second differencer 104 has been delayed by at least three (3) reference clock pulses 22 more than the 4-bit digital data stream applied to the first differencer 102 by the 4-bit digital registers 88–92. Thus, the 4-bit digital data stream represents a portion of the digital video signal 14 before the point where the horizontal sync pulse 16 occurred which is substantially a flat line having no slope, assuming a horizontal sync pulse 16 has been detected.

The 4-bit digital data stream from the differencer 104 is applied to a second binary weighted comparator 106 which compares this digital data to another predetermined reference value, preferably set to two (2), which would indicate essentially a substantially small slope or a flat portion of a waveform. If the digital data is less than or equal to the predetermined reference value of two (2), the binary weighted comparator 106 outputs a digital high output. Thus, the falling edge detector 86 essentially forms a circuit which looks for a point in the digitized video signal 14 where the cumulative drop in three samples is greater than or equal to eight (8) and the last value was less than or equal to two (2). When this condition occurs, the falling edge of the digitized horizontal sync pulse 16 has been detected. The outputs from the binary weighted comparators 102 and 106 are each applied to an AND gate 108. If both inputs to the AND gate go high indicating a flat portion followed by a steep slope (i.e. falling edge), the AND gate 108 outputs a high timing pulse identified as the external horizontal sync pulse 30. The combination of both conditions being met simultaneously increases noise immunity.

Figure 7:
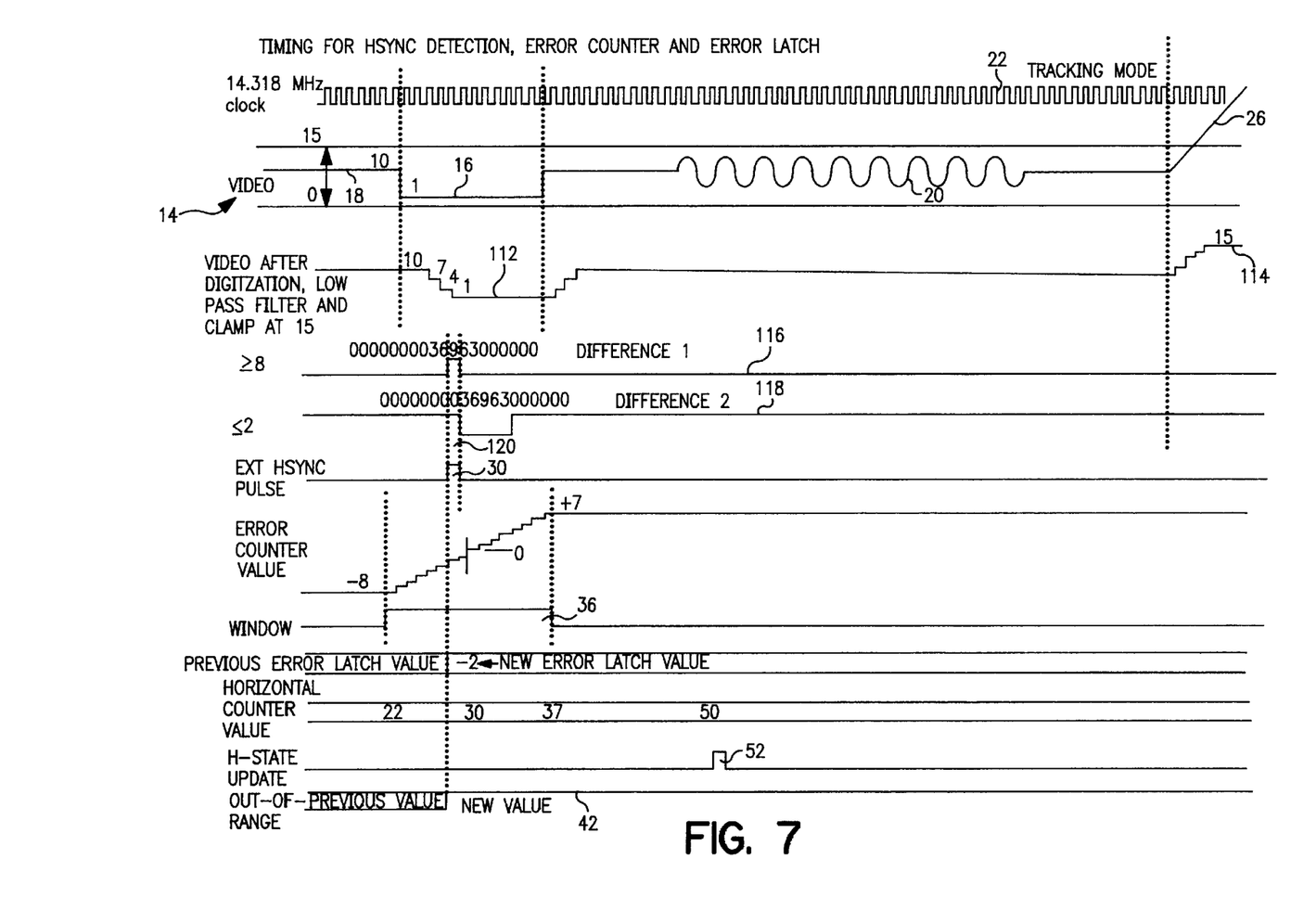
FIGS. 7 and 8 are a series of waveform diagrams generated when the present invention is in a track mode.
Figure 9:
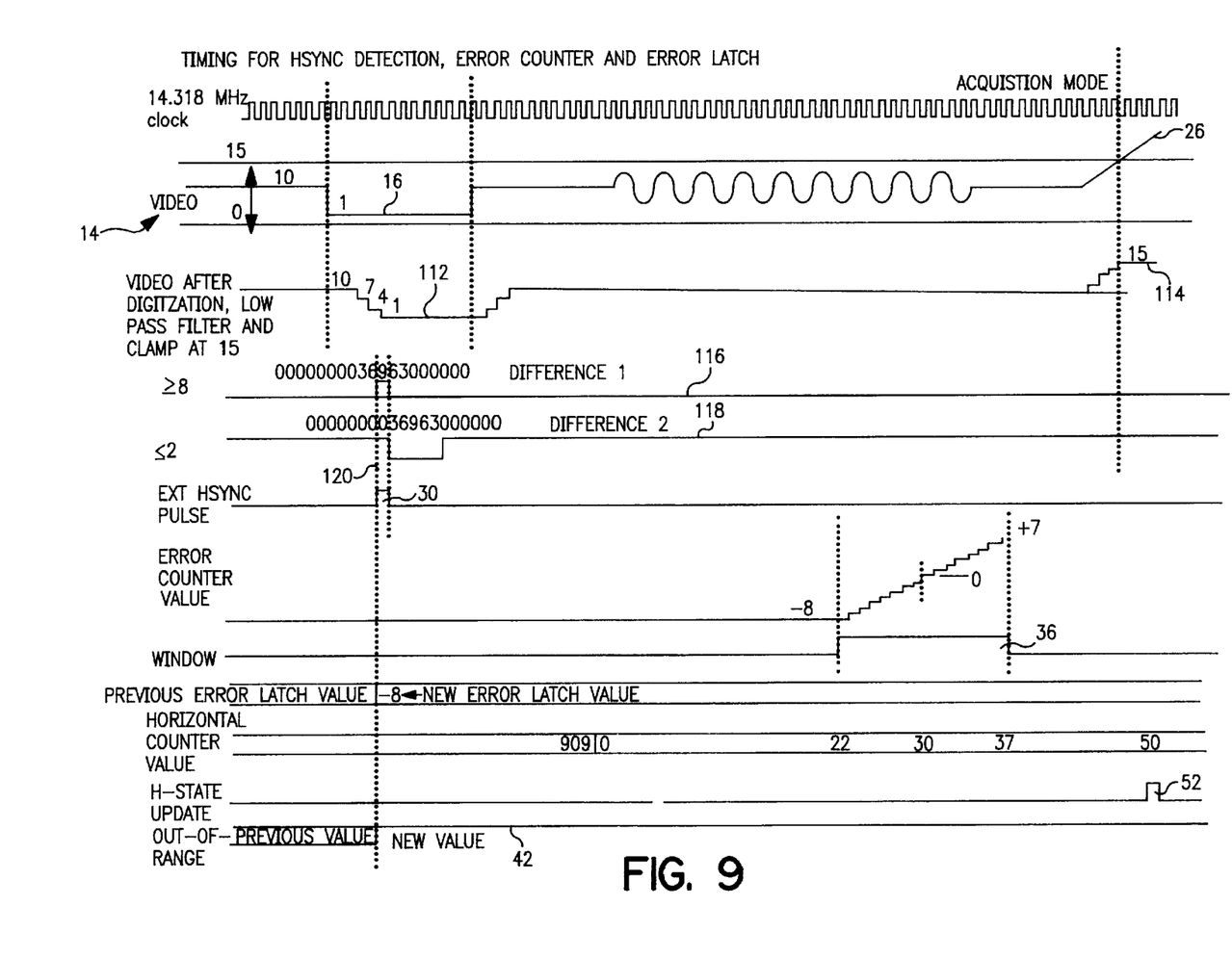
FIGS. 9 and 10 are a series of waveform diagrams generated when the present invention is in an acquisition mode.

Referring to FIGS. 7 and 9, waveform diagrams showing the operation of the horizontal sync detection circuit 24 are shown. As seen in FIGS. 7 and 9, upon digitizing the video signal 14, the low pass filter 64 filters the horizontal sync pulse 16 such that the sharp edge of the waveform is smoothed out and any spurious noise is eliminated, as shown by portion 112 of the digital data. Additionally, the clamping circuit 78 clamps the digitized data to a value of 15 to eliminate the active video portion 26 of the video signal 14, as shown by portion 114 of the digitized data. Waveform 116 shows the output of the binary weighted comparator 102 as the slope exceeds the predetermined value of 8. This occurs when the digital register 92 has a value of ten (10) and the digital register 84 has a value of one (1) such that the difference from differencer 100 is nine (9). Waveform 118 shows the output from the binary weighted comparator 106 when the slope is very small or less than 2. This occurs when the digital register 98 has a value of ten (10) and the digital register 94 has a value of ten (10) such that the difference from the differencer 104 is zero (0). At point 120, the output of both binary weighted comparators 102 and 106 are high such that the AND gate 108 outputs the external horizontal sync pulse 30.

Figure 3:
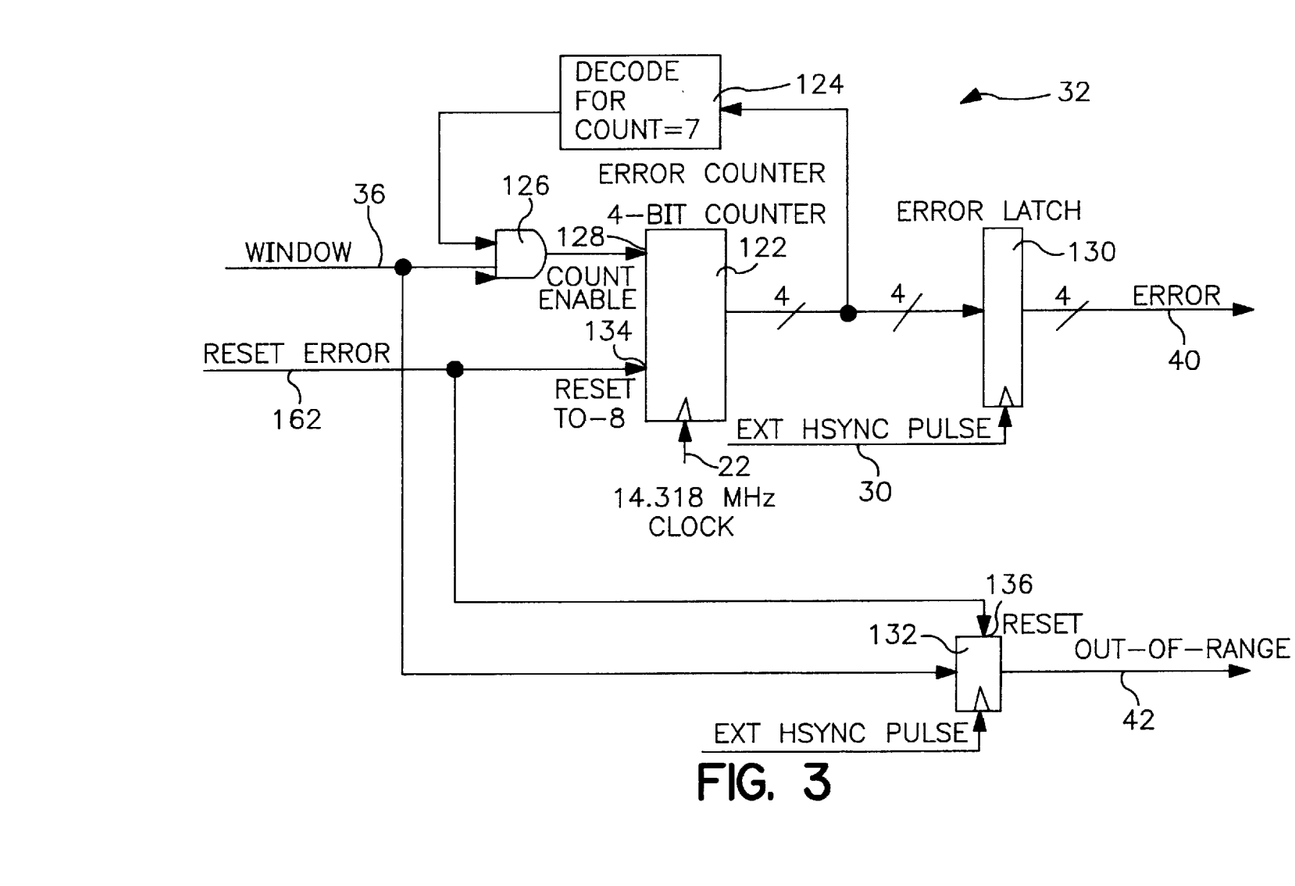
FIG. 3 is a schematic block diagram of a sync position error circuit of the present invention.

Referring to FIG. 3, a detailed schematic block diagram of the sync position error circuit 32 is shown. The sync position error circuit 32 includes a 4-bit counter 122, a 4-bit digital decoder 124 and an AND gate 126. The 4-bit digital counter 122 counts between −8 and +7 when the window pulse 36 is high and the counter 122 has not counted to its maximum value of +7, as shown in FIGS. 7–10. When the window pulse 36 is high, and the value of the counter 122 has not reached +7, the two inputs to the AND gate 126 are high causing the AND gate 126 to output a digital high to a count enable input 128 of the 4-bit digital counter 122. During this time, the counter 122 which is clocked by the reference clock 22, outputs a 4-bit digital data stream which increments up in binary numbers from −8 to +7 under 2's complement arithmetic which is used throughout the digital video horizontal synchronization pulse detector and processor 10.

This 4-bit digital data stream is applied to the decoder 124 which decodes the 4-bit digital data and outputs a low output when the count equals +7. When this occurs, the output from the AND gate 126 goes low which subsequently disables the counter 122 from further counting. In addition to applying the 4-bit digital data stream to the decoder 124, the 4-bit digital data stream is also applied to a 4-bit latch 130. The 4-bit latch 130 latches the value of the counter 122 upon receiving the external horizontal sync pulse 30 from the horizontal sync detection circuit 24. The digital value in the latch 130 represents the error of the rising edge of the external horizontal sync pulse 30 with respect to the center of the window pulse 36, as seen in FIG. 7, when the external horizontal sync pulse 30 occurs within the window pulse 36. If the external horizontal sync pulse 30 does not occur within the window pulse 36, the error is limited to the maximum value of +7, to provide noise immunity to the horizontal sync detector and processor 10. This error is outputted from the error output 40 and received by the error input 56 of the long term averaging circuit 58.

The sync position error circuit 32 also includes a 1-bit latch 132 which latches the window pulse 36 upon receipt of the external horizontal sync pulse 30. If the external horizontal sync pulse 30 occurs when the window pulse 36 is high, the latch 132 latches a 1-bit digital high output to the out-of-range output 42 which indicates that the external sync pulse occurred during the window pulse 36, as shown by the out-of-range output 42 in FIG. 7. If the window pulse 36 is low when the external horizontal sync pulse 30 occurs, the latch 132 latches a 1-bit digital low output at the out-of-range output 42, shown in FIG. 9, which indicates that the external horizontal sync pulse 30 did not occur during the window pulse 36. After each external horizontal sync pulse 30 occurs, the 4-bit counter 122 and the latch 132 are reset from the horizontal counter 48 with a reset error pulse 162. This reset error pulse 162 is applied to a reset input 134 of the 4-bit counter 122 and a reset input 136 of the latch 132.

Figure 4:
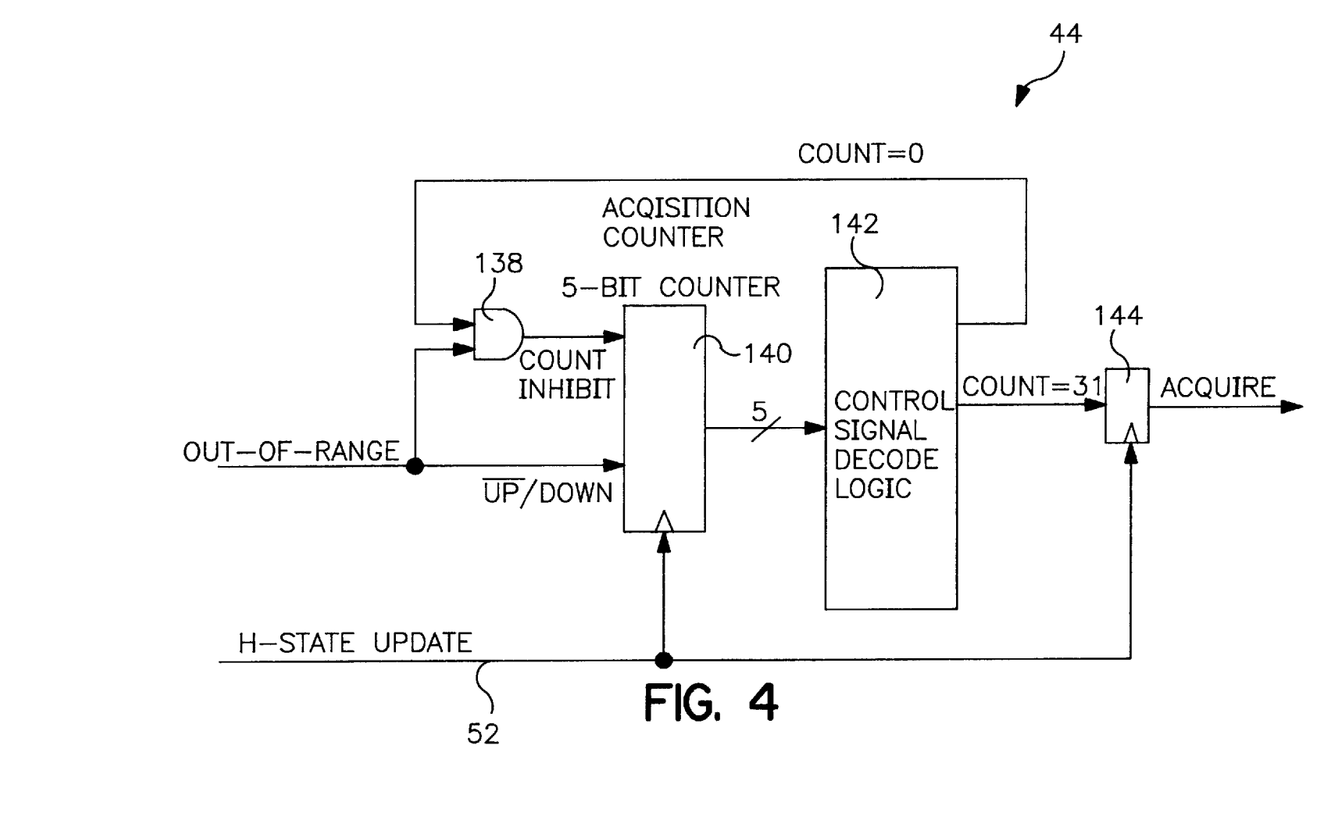
FIG. 4 is a schematic block diagram of an acquisition circuit of the present invention.

Referring to FIG. 4, a detailed schematic block diagram of the acquisition circuit 44 is shown. The acquisition circuit 44 includes an AND gate 138, a 5-bit D-Q digital counter 140, a 5-bit decoder 142 and a digital register 144. The counter 140 counts up when the out-of-range output 42 is low and counts down when the out-of-range output 42 is high. The counter 140 is incremented up or down on each H-state update pulse 52, after an external horizontal sync pulse 30 is generated. The 5-bit digital data stream from the counter 140 is applied to the digital decoder 142 which outputs a digital high output at count equals 0 and a digital high output at count equals 31.

At count equals 0, the digital high output is applied to the AND gate 138 such that if the out-of-range output 42 is high, indicating the counter should count down on the next H-state pulse 52, the two high inputs to the AND gate 138 generate a high output which inhibits the counter 140 from counting below zero (0). Upon reaching the count equal 31, the decoder 142 applies a digital high output to the digital register 144. Upon receipt of the next H-state update pulse 52, the digital register 144 outputs the digital high output to the acquire input 46, which places the horizontal counter 48 in the "acquire" mode. It should be noted that since the counter 140 is a 5-bit counter, it rolls over to a value of zero (0) after the count 31, therefore no resetting of the counter 140 is required.

Figure 5:
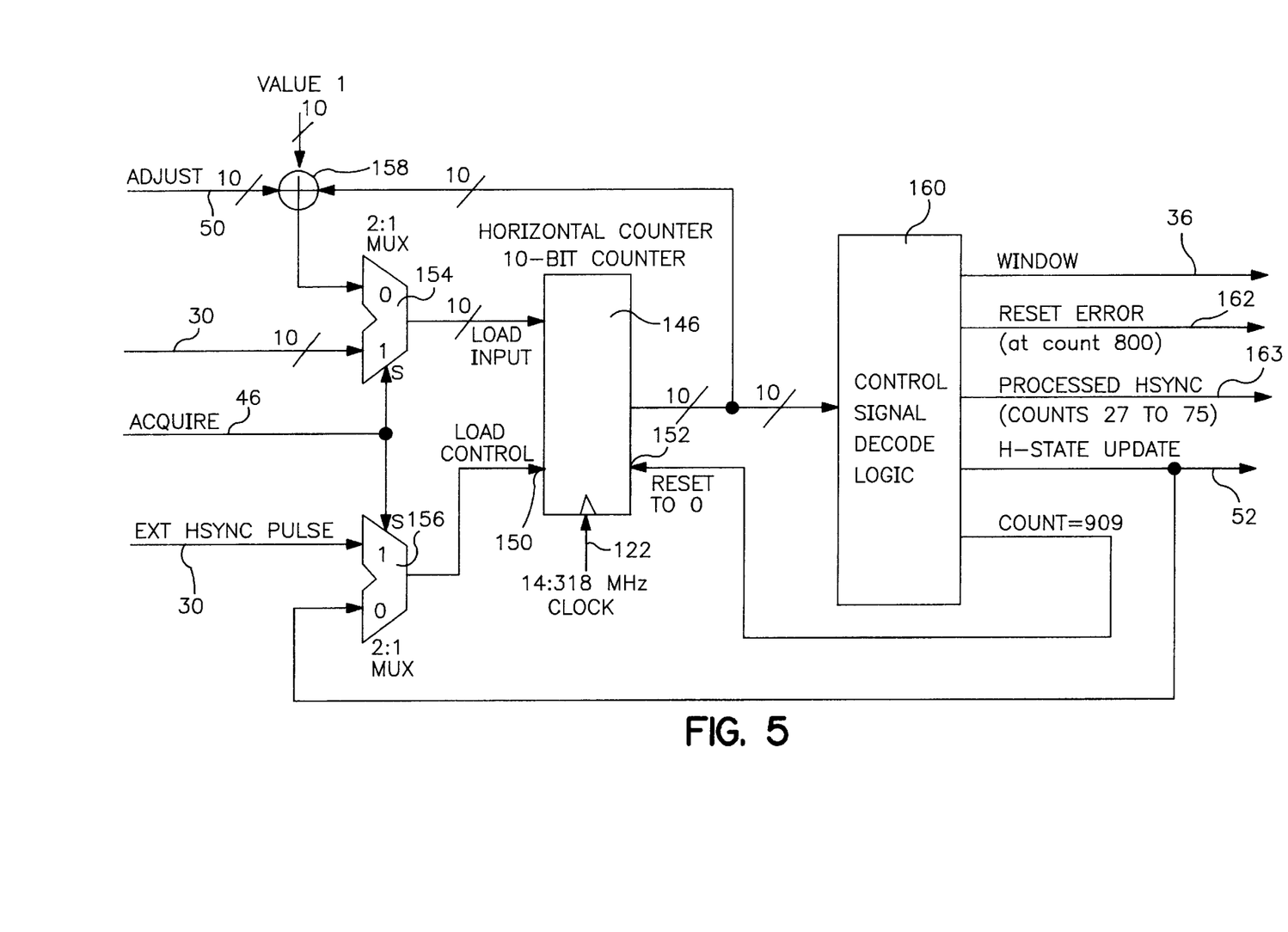
FIG. 5 is a schematic block diagram of a local horizontal counter and window generation circuit of the present invention.

Referring to FIG. 5, a detailed schematic block diagram of the horizontal counter 48 and the window generating circuit 54 is shown. This circuit includes a 10-bit digital counter 146 which counts up from 0 to 909 in increments of 1 at each reference clock pulse 22, seen in FIGS. 8 and 10. The counter 146 includes a load input 148, a load control input 150 and a reset 152. When the load control input 150 receives a digital high, the 10-bit digital value at the load input 148 is loaded into the counter 146 which immediately puts the counter 146 at that count value. The value at the load input 148 is determined by a 10-bit 2-to-1 multiplexer 152 which is controlled by the acquire input 46. The load control input 150 is controlled by a 1-bit 2-to-1 multiplexer 156 which is also controlled or selected by the acquire input 46.

When the acquire input 46 is low, which indicates that the horizontal counter 48 is in the "track" mode, the value applied to the load input 148 is received from a 10-bit adder 158. The adder 158 adds the current value of the counter 146 with a 10-bit binary value of one (1) thereby incrementing the counter up by one (1). In addition, the value at the adjust input 50 which has been extended from 4-bits to 10-bits is added to the adder 158. This value represents the average error of the external horizontal sync pulse 30 with respect to the center of the window pulse 36. This loaded value from the adder 158 should substantially center the window pulse 36 with the next external horizontal sync pulse 30 so that the counter 146 remains locked to the external horizontal sync pulse 30. The value loaded in the load input 148 is loaded during the H-state update pulse 52 which is set to occur at count equal 50 of the counter 146. Thus, at count equal 50, the adder 158 adds to the count value=50, a count value of 1, plus an adjust value to position the counter 146 at a new value.

Figure 10:
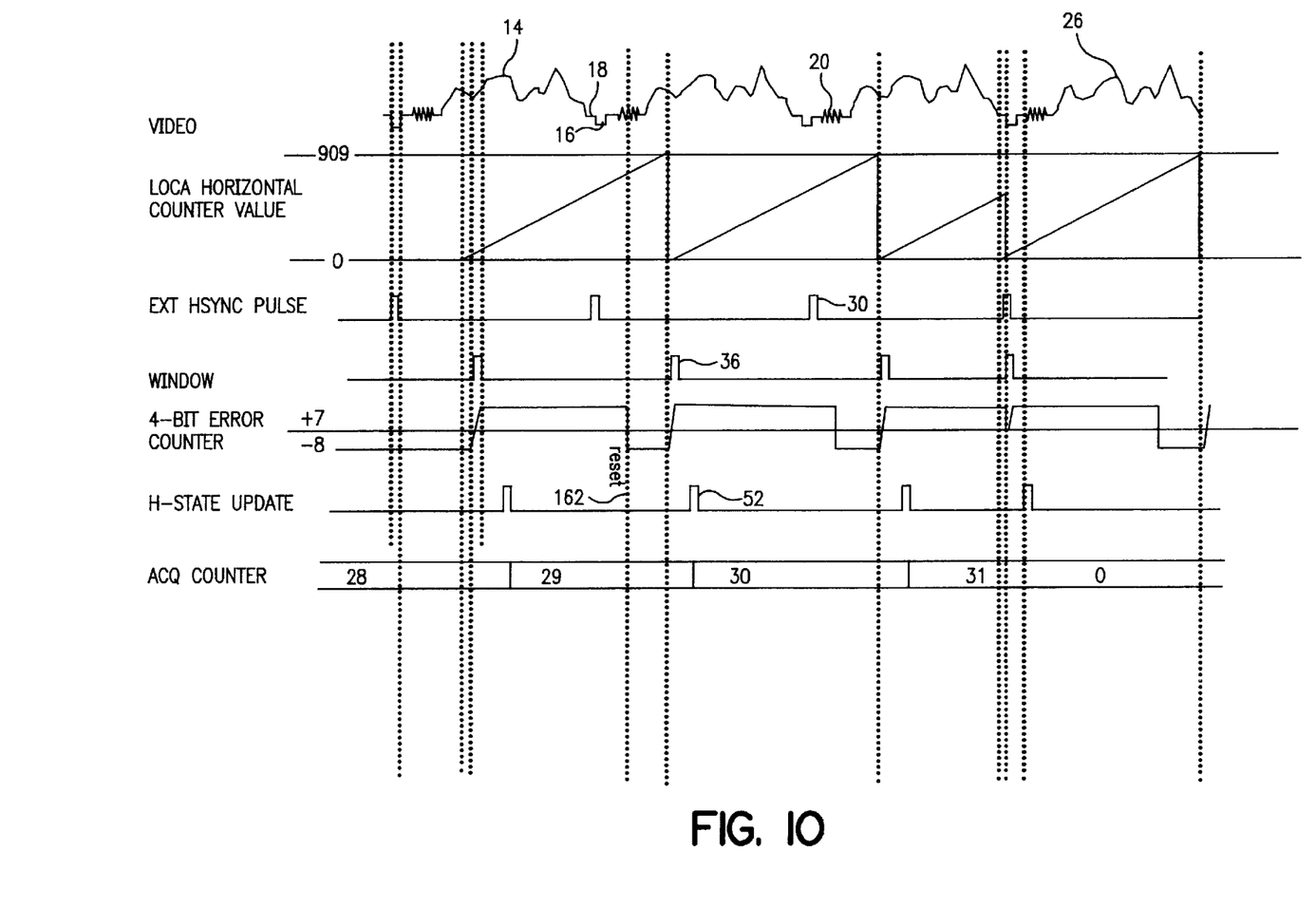

When the acquire input 46 is a digital high, indicating that the horizontal counter 48 is in the "acquire" mode, a predetermined fixed value of 30 is loaded, via the multiplexer 154, into the load input 148, as shown in FIG. 10. This occurs during the external horizontal sync pulse 30 which is applied to the load control 150, via the multiplexer 156, which substantially centers the window pulse 36 during the external horizontal sync pulse 30. This ultimately moves or positions the counter 146 into phase-lock with the external horizontal sync pulse 30.

The 10-bit digital data stream output from the counter 146 is applied to a 10-bit digital decoder 160 which decodes the 10-bit digital data stream and outputs digital high outputs at various counts. The decoder 160 outputs the window pulse 36 during counts 22 to 37. A reset error pulse 162 occurs at count 800 which is used to reset the 4-bit counter 122 and the latch 132 in the sync position error circuit 32. At count 909, a high input is applied to the reset input 152 to reset the counter 146 to 0 so that the counter continuously counts between 0 and 909. A processed H-sync 163 is generated during counts 27 to 75 which represents the regenerated digital representation of the horizontal sync pulse 16. The H-state update 52 occurs at count 50 which is used by the counter 146 during the "track" mode, as well as to increment the 5-bit counter 140 in the acquisition circuit 44.

Figure 6A:
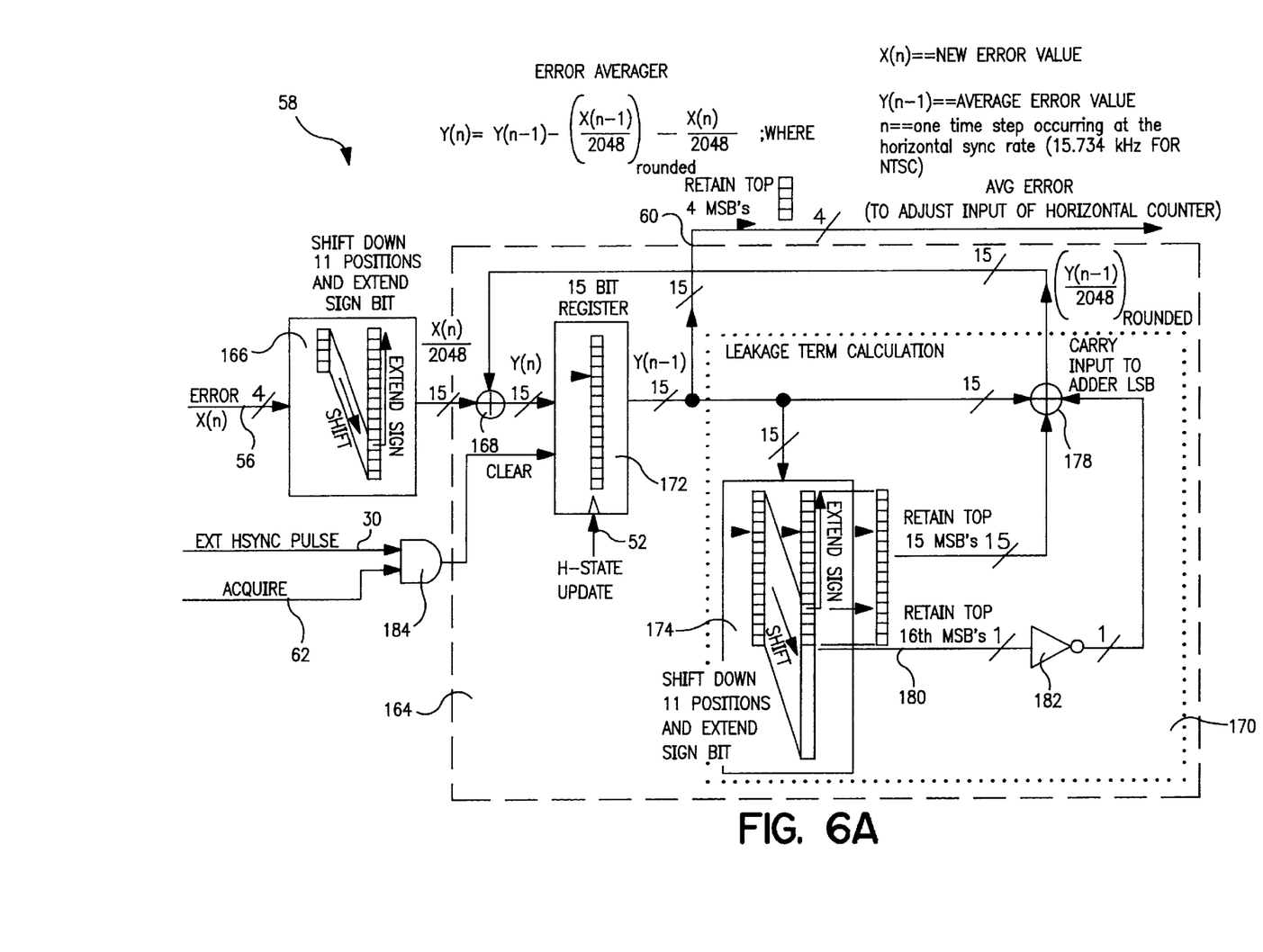
FIG. 6A is a schematic block diagram of a long term averaging circuit of the present invention.

Turning to FIG. 6A, a schematic block diagram of the long term averaging circuit 58 is shown. The long term averaging circuit 58 essentially receives the error value signal from the error input 56 and averages the value representative of the error signal in a leaky accumulator 164 using the following recursive formula:

$$Y(n) = Y(n-1) - \left( \frac{Y(n-1)}{2048} \right)_{rounded} - \frac{X(n)}{2048}$$

The averaging of the error value signal using this recursive formula provides substantial noise immunity to the overall operation of the digital video horizontal synchronization pulse detector and processor 10.

The 4-bit digital error value signal from the error output 40 of the sync position error circuit 32 is first applied to the error input 56 of the long term averaging circuit 58. This error value signal is applied to block 166 which shifts the 4-bit digital data down 11 positions to essentially divide the error value signal by 2,048 and extends the sign bit by 11 bits under two's complement to generate a 15-bit number, with the four (4) least significant bits (LSBs) representing the term:

$$\frac{X(n)}{2048}$$

of the recursive formula.

Figure 6B:
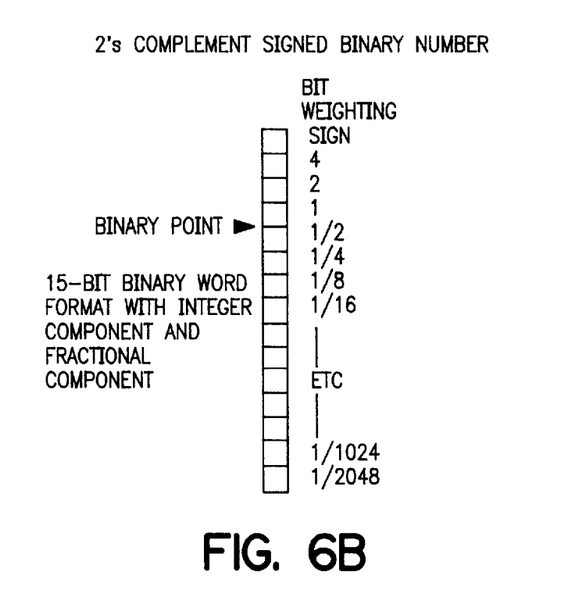
FIG. 6B is a representation of a binary number configuration used by the long term averaging circuit.

Turning to FIG. 6B, the latest average error Y(n-1) consists of the top four (4) most significant bits (MSBs) of the 15-bit number with the most significant bit representing the sign bit and the binary point being between the fourth and fifth most significant bits. The error value signal from the sync position error circuit 32 (i.e. X(n)/2048) consists of the bottom 4-bit fractional portion of this 15-bit number such that as these errors are accumulated over time, the fractional errors effect the 4-bit integer value (i.e. Y(n-1)).

The 15-bit digital data from block 166 is applied to a 15-bit adder 168 of the leaky accumulator 164. If the error value (i.e. X(n)/2048) is zero for several horizontal sync pulses 16, the leaky accumulator 164 will bleed down exponentially over time during each H-state update 52 because of a leakage portion 170 of the leaky accumulator 164.

The leaky accumulator 164 includes a 15-bit digital register or accumulator 172 which accumulates the average error Y(n). The 15-bit register 172 accumulates the average error Y(n) once per horizontal line during the H-state update 52. The output from the 15-bit register 172 represents the term Y(n-1) of the recursive equation which is the most up-to-date average error. This term is shifted down by 11 positions and a sign bit is extended by 11 positions at block 174 which essentially forms a 26-bit number. At block 174, the top 16 most significant bits (MSBs) are taken. The top 15 bits (MSBS) of the 16-bit number represents the error portion and the bottom first bit or sixteenth bit (MSB) represents a rounding bit. At output 176, the top 15 most significant bits (MSBs) of the 16-bit number are taken and applied to an adder 178. At output 180, the sixteenth (16) most significant bit (MSB) or rounding bit is taken and inverted at inverter 182 before being applied to the adder 178. The adder 178 also receives the Y(n-1) term to generate the:

$$\left( \frac{Y(n-1)}{2048} \right)_{rounded}$$

portion of the recursive formula. This 15-bit value is then applied to the adder 168.

By inverting the rounding term in the inverter 182, the leaky accumulator 164 is essentially rounding to have an equilibrium point at "0000.0111111111" binary, which is just less than 0.5 decimal. This equilibrium point is the stable value to which the leaky accumulator 164 converges after receiving an input error value (i.e. X(n)) of 0 for a long period of time. This value is practically midway between the values of "0001.00000000000" and "1111.11111111111", which are the points where the accumulator "rolls" over to an adjacent error correction value and causes a correction of +1 or −1, respectively. The equilibrium point is positioned here so that it will not be close to a boundary, since this would produce jittering in the display image. At output 60, the top four (4) most significant bits (MSBs) from the register 172 are taken and used for the most up-to-date average error (Y(n-1)).

If the acquisition circuit 44 accumulates its maximum predetermined value of 31, thereby generating a high output, this high output is applied to the acquire input 62 of the long term averaging circuit 58 which is applied to an AND gate 184. During the next external horizontal sync pulse 30, which is also applied to the AND gate 184, the 15-bit register 172 is reset or cleared, via the AND gate 184, so that a new average error can be accumulated. This assures a more accurate average error and further noise immunity.

Figure 8:
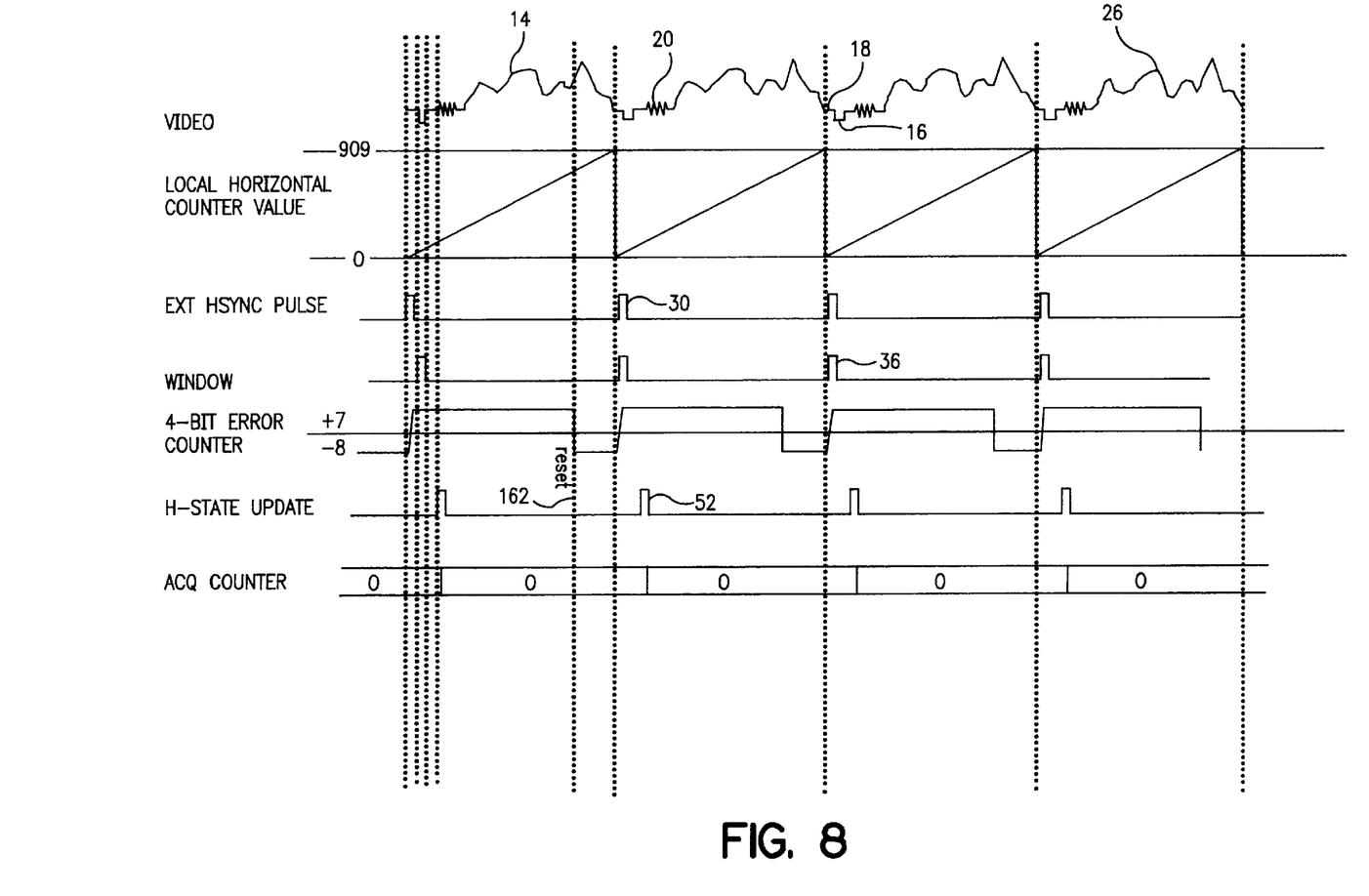

Referring to FIGS. 8 and 10, the operation of the horizontal synchronization pulse detector and processor 10 is shown in a track mode and an acquisition mode as discussed above. Referring specifically to FIG. 8, the operation of the horizontal sync detector and processor 10 in the track mode is shown. FIG. 8 shows the video signal 14 and how the horizontal counter 48 counts with respect to the video signal 14 to produce the external horizontal sync pulse 30 within the window pulse 36. In addition, FIG. 8 shows the output of the 4-bit counter 122 of the sync position error circuit 32 which counts from −8 to +7 during the window pulse 36 and is reset by the reset error 162 from the horizontal counter 48 at count 800.

Referring to FIG. 10, the horizontal synchronization pulse detector processor 10 is shown in the acquisition mode. In the acquisition mode, the count value from the horizontal counter 48 is not aligned with the video signal 14 so that the external horizontal sync pulse 30 does not occur during the window pulse 36. Assuming the first three horizontal sync pulses 16 shown in the video signal 14 occur at counts 28–30 of the acquisition circuit 44, upon the subsequent horizontal sync pulse 16 (i.e. count 31), the value in the horizontal counter 48 is loaded or knocked to a value of 30 when the acquire input 46 is high, thereby subsequently aligning the count value in its proper location with respect to the video signal 14 so that the external horizontal sync pulse 30 occurs within the window pulse 36.

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined in the following claims.

What is claimed is:

1. A digital video horizontal synchronization pulse detector and processor for detecting and processing a horizontal synchronization pulse in a video signal, said detector and processor comprising:

pulse detection means for generating a timing pulse in response to said horizontal synchronization pulse;

window generation means for generating a window pulse having a predetermined duration;

sync position error means for generating a time position error signal of said timing pulse relative to said window pulse;

averaging means for generating an average error signal in response to said time position error signal; and horizontal counter means for generating a processed horizontal sync pulse in response to said timing pulse, whereby when said timing pulse occurs within said window pulse said counter means is adjusted by said average error signal, and when a predetermined number of timing pulses occur outside said window pulse said horizontal counter means is loaded with a predetermined value.

2. The detector and processor as defined in claim 1 wherein said pulse detection means includes a low pass filter means for filtering a digital data stream digitized from the video signal in an analog-to-digital converter and a clamping means for clamping the digital data stream to a predetermined value.

3. The detector and processor as defined in claim 2 wherein said pulse detection means further includes a falling edge detector means for determining a falling edge of the horizontal synchronization pulse in the digital data stream.

4. The detector and processor as defined in claim 3 wherein said falling edge detector means includes a first slope detection means for determining a substantially steep slope which identifies an edge of a pulse in the digital data stream and a second slope detection means for determining a substantially small slope which identifies a flat portion of a pulse in the digital data stream, wherein when said first slope detection means detects said substantially steep slope and said second slope detection means detects said substantially small slope, said falling edge detector means determines the falling edge of the horizontal synchronization pulse in the digital data stream and generates said timing pulse.

5. The detector and processor as defined in claim 1 wherein said sync position error means generates an out-of-range signal for identifying when said timing pulse does not occur within said window pulse.

6. The detector and processor as defined in claim 5 wherein said sync position error means includes counter means for counting during said window pulse to generate said time position error signal of said timing pulse relative to said window pulse.

7. The detector and processor as defined in claim 6 wherein said window pulse limits a maximum time position error signal when said timing pulse does not occur within said window pulse.

8. The detector and processor as defined in claim 1 further comprising acquisition means for accumulating the number of times said timing pulse occurs outside said window pulse.

9. The detector and processor as defined in claim 8 wherein said acquisition means includes a counter which is incremented positively when said timing pulse occurs outside said window pulse and incremented negatively when said timing pulse occurs during said window pulse.

10. The detector and processor as defined in claim 9 wherein when said counter is incremented positively to said predetermined number, said horizontal counter means is loaded with said predetermined value and said averaging means is set to zero.

11. The detector and processor as defined in claim 1 wherein said horizontal counter means includes a counter which is clocked by a reference clock and has a period substantially equal to the period of a single horizontal line of said video signal.

12. The detector and processor as defined in claim 11 wherein when the predetermined number of timing pulses occur outside said window pulse, said horizontal counter means is loaded with the predetermined value during said timing pulse to align said timing pulse within said window pulse.

13. The detector and processor as defined in claim 1 wherein said averaging means includes a leaky accumulator means for accumulating said average error signal in response to said time position error signal.

14. The detector and processor as defined in claim 13 wherein said averaging means divides said time position error signal by a divide value to generate a fractional error signal with respect to said average error signal which is applied to said leaky accumulator means.

15. The detector and processor as defined in claim 14 wherein said leaky accumulator means includes an adder operable to receive said fractional error signal, a digital register operable to accumulate said fractional error signal to generate said average error signal and leakage means for generating a leakage term which is summed by said adder.

16. A digital video horizontal synchronization pulse detector and processor for detecting and processing horizontal synchronization pulses in a video signal, said detector and processor comprising:

a pulse detector, said pulse detector operable to generate a timing pulse in response to each horizontal synchronization pulse;

a sync position error device, said sync position error device operable to generate a time position error signal for each timing pulse relative to a corresponding window pulse;

a window pulse generator, said window pulse generator operable to generate said window pulses and limit said time position error signal to a maximum value;

an acquisition device, said acquisition device operable to track when said timing pulses occur inside and outside said corresponding window pulses;

an averaging device, said averaging device operable to generate an average error signal in response to said time position error signal; and a counter, said counter operable to phase lock to said timing pulses to generate processed horizontal sync pulses, whereby when said timing pulses occur within said corresponding window pulses said counter is adjusted by said average error signal, and when said acquisition device identifies when a predetermined number of timing pulses occur outside said corresponding window pulses, said counter is loaded with a predetermined value during a timing pulse to align said timing pulses with said corresponding window pulses.

17. The detector and processor as defined in claim 16 wherein said pulse detector includes a low pass filter comprising a plurality of cascaded digital registers clocked by a reference clock, whereby the output of the digital registers are applied to an adder for filtering a digital data stream digitized from the video signal.

18. The detector and processor as defined in claim 16 wherein said pulse detector includes a falling edge detector operable to detect a falling edge of each horizontal synchronization pulse by identifying the falling edge of said horizontal synchronization pulses and a substantially flat portion of said horizontal synchronization pulses.

19. The detector and processor as defined in claim 16 wherein said sync position error device includes an error counter operable to count between a predetermined error boundary during said window pulse to generate said time position error signal of said timing pulses relative to a center of said corresponding window pulses.

20. The detector and processor as defined in claim 16 wherein said acquisition device includes a counter which increments positively to said predetermined number when said timing pulses occur outside said corresponding window pulses and increments negatively to a predetermined minimum value when said timing pulses occur during said corresponding window pulses.

21. The detector and processor as defined in claim 16 wherein said averaging device divides said time position error signals by a divide value to generate fractional error signals which are applied to a leaky accumulator to generate said average error signal.

22. A method for detecting and processing horizontal synchronization pulses in a video signal to generate processed horizontal sync pulses, said method comprising the steps of:

generating a timing pulse in response to each horizontal synchronization pulse;

generating a time position error signal for each timing pulse relative to a window pulse;

averaging said time position error signals to generate an average error signal;

identifying when said timing pulses occur outside said corresponding window pulses;

identifying when said timing pulses occur inside said corresponding window pulses;

adjusting a counter with said average error signal when the timing pulses occur inside said corresponding window pulses;

loading a predetermined value into said counter when a predetermined number of timing pulses occur outside said corresponding window pulses during a timing pulse to align said timing pulses with said corresponding window pulses; and generating the processed horizontal sync pulses.

23. The method as defined in claim 22 further including the step of limiting the time position error signals to a maximum value.

24. The method as defined in claim 22 wherein the steps of identifying when said timing pulses are inside or outside said corresponding window pulses further includes the step of tracking the number of times said timing pulses occur inside and outside said corresponding window pulses.

25. The method as defined in claim 22 wherein the step of generating a timing pulse includes the steps of:

identifying an edge of pulse; and identifying a substantially flat portion of said pulse to determine that said pulse is said horizontal sync pulse.

26. The method as defined in claim 22 wherein the step of averaging said time position error signals further includes the step of dividing said time position error signals by a divide value to generate a fractional error portion of said average error signal.

* * * * *